United States Patent
Siniaguine et al.

(10) Patent No.: US 6,168,697 B1
(45) Date of Patent: Jan. 2, 2001

(54) HOLDERS SUITABLE TO HOLD ARTICLES DURING PROCESSING AND ARTICLE PROCESSING METHODS

(75) Inventors: Oleg Siniaguine, Santa Cruz; Steven Kaufman, Redwood City, both of CA (US)

(73) Assignee: TruSi Technologies LLC, Sunnyvale, CA (US)

( * ) Notice: Under 35 U.S.C. 154(b), the term of this patent shall be extended for 0 days.

(21) Appl. No.: 09/038,642

(22) Filed: Mar. 10, 1998

(51) Int. Cl.[7] .............................. C23C 14/34; C23C 16/00
(52) U.S. Cl. .............................. 204/298.15; 204/192.12; 118/728; 156/345
(58) Field of Search ........................... 204/192.2, 192.12, 204/298.15; 118/503, 500, 728; 269/21; 294/64.3; 56/345

(56) References Cited

U.S. PATENT DOCUMENTS

| | | | |
|---|---|---|---|
| 3,438,668 | 4/1969 | Olsson et al. | 294/64.3 |
| 3,466,079 | 9/1969 | Mammel | 294/64.3 |
| 3,523,706 | 8/1970 | Logue | 294/64.3 |
| 3,539,216 | 11/1970 | Forcier | 294/64.3 |
| 4,002,254 | 1/1977 | Olofsen | 214/300 |
| 4,029,351 | 6/1977 | Apgar et al. | 294/64.3 |

(List continued on next page.)

FOREIGN PATENT DOCUMENTS

| | | | |
|---|---|---|---|
| 0 295 785 | 12/1988 | (EP) | H01L 21/68 |
| 0 807 964 | 11/1997 | (EP) | H01L 21/3065 |
| 2-303047 | 12/1990 | (JP) | H01L 21/68 |
| 537924 | 2/1977 | (SU) . | |
| WO 92/12273 | 7/1992 | (WO) . | |
| WO 92/12610 | 7/1992 | (WO) . | |
| WO 96/21943 | 7/1996 | (WO) . | |
| WO 97/16847 | 5/1997 | (WO) | H01L 21/304 |
| WO 97/45856 | 12/1997 | (WO) . | |
| WO 97/45862 | 12/1997 | (WO) . | |

OTHER PUBLICATIONS

U.S. Patent Application 08/975,403 "Plasma Processing Methods and Apparatus" filed Nov. 20, 1997 by O. Siniaguine.
English language abstract of USSR Patent Doct. 1812102 dated Apr. 30, 1993.
U.S. Patent Application 08/781,568 "Plasma Generation and Plasma Processing of Materials" filed Jan. 9, 1997 by O. Siniaguine.
U.S. Patent Application 60/030,425 "Back–Side Contact Pads" filed Oct. 29, 1996 by O. Siniaguine.
PCT Application PCT/Us97/18979 "Integrated Circuits and Methods for Their Fabrication" filed Oct. 27, 1997;.
Yu. M. Agrikov et al., "Dynamic Plasma Treatment of HIC (Hybrid Integrated Circuit) Substrates", Elektronnaya Tehnika, Ser. 10, 5(71), 1988, pp. 30–32.
P.P. Kulik, "Dynamic Plasma Treatment (DPT) of a Surface of a Solid Body", Plazmohimiya–87, Part 2 (U.S.S.R. Academy of Science, Institute Neftehimicheskogo Sinteza im. A. V. Topchieva, Moscow, 1987), pp. 4–13.
Yu. M. Agrikov et al., "Foundations of a Realization of a Method of Dynamic Plasma Treatment of a Surface of a Solid Body" (Plazmohimiya–87, Part 2 (U.S.S.R. Academy of Science, Institute Neftehimicheskogo Sinteza im. A.V. Topchieva, Moscow, 1987), pp. 58–96.

Primary Examiner—Nam Nguyen
Assistant Examiner—Gregg Cantelmo
(74) Attorney, Agent, or Firm—Skjerven Morrill MacPherson LLP; Michael Shenker

(57) ABSTRACT

An article holder uses a gas flow, for example, a vortex, to hold the article in a desired position. The gas flow is substantially restricted to an article portion reserved for handling. The result of the processing is less sensitive to the condition (e.g. temperature) of that portion than to the condition of the rest of the article. Therefore, if the gas flow affects the condition (e.g., temperature) of the article portion contacting the gas flow, the processing result is improved.

19 Claims, 2 Drawing Sheets

U.S. PATENT DOCUMENTS

| | | | |
|---|---|---|---|
| 4,118,058 | 10/1978 | Rahn et al. | 294/64.3 |
| 4,257,637 | 3/1981 | Hassan et al. | 294/64.3 |
| 4,508,161 * | 4/1985 | Holden | 118/503 |
| 4,566,726 | 1/1986 | Correnti et al. | 294/64.3 |
| 4,603,466 * | 8/1986 | Morley | 118/503 |
| 4,969,676 | 11/1990 | LaMagna | 294/64.3 |
| 5,022,695 | 6/1991 | Ayers | 294/88 |
| 5,077,888 | 1/1992 | Tokisue et al. | 29/467 |
| 5,080,549 | 1/1992 | Goodwin et al. | 414/744.8 |
| 5,169,196 | 12/1992 | Safabakhsh | 294/64.3 |
| 5,238,499 * | 8/1993 | Van De Ven et al. | 204/298.15 |
| 5,262,029 * | 11/1993 | Erskine et al. | 204/298.15 |
| 5,324,155 | 6/1994 | Goodwin et al. | 414/744.5 |
| 5,368,645 * | 11/1994 | Bok | 118/503 |
| 5,370,709 * | 12/1994 | Kobayashi | 118/728 |
| 5,445,677 * | 8/1995 | Kawata et al. | 118/728 |
| 5,492,566 | 2/1996 | Sumnitsch | 118/500 |
| 5,513,668 | 5/1996 | Sumnitsch | 134/157 |
| 5,542,559 * | 8/1996 | Kawakami et al. | 118/728 |
| 5,578,532 * | 11/1996 | Van De Ven et al. | 118/728 |
| 5,590,996 | 1/1997 | Thompson et al. | 414/416 |
| 5,632,873 * | 5/1997 | Stevens et al. | 204/298.15 |
| 5,692,873 * | 12/1997 | Weeks et al. | 204/298.15 |
| 5,697,427 * | 12/1997 | Ngan et al. | 118/728 |

* cited by examiner

HOLDERS SUITABLE TO HOLD ARTICLES DURING PROCESSING AND ARTICLE PROCESSING METHODS

CROSS-REFERENCE TO RELATED APPLICATIONS

Not applicable.

STATEMENT REGARDING FEDERALLY SPONSORED RESEARCH

Not applicable.

BACKGROUND OF THE INVENTION

The present invention relates to article holders suitable for holding articles being processed, and more particularly to holders which use gas flow to hold articles.

Holders that use gas flow are widely used in different industries including, for example, the semiconductor manufacturing industry. Examples of such holders are vortex holders described in PCT Publication WO 97/45862 "Non-Contact Holder for Wafer-Like Articles" (Dec. 4, 1997). Other examples are holders based on the Bernoulli principle.

It is desirable to provide improved article holders that use gas flow.

SUMMARY

The inventor has observed that the gas flow emitted by the holder can have a negative effect on the article processing by affecting the temperature or other conditions at different parts of the article. Of note, some semiconductor wafer processes, e.g. plasma etches, are quite sensitive to the wafer temperature. For example, a plasma etch of silicon dioxide may have an etch rate that changes by a factor of 10 as the wafer temperature changes from 100° C. to 300° C. Some plasma etches of silicon nitride are also sensitive to the wafer temperature. If, for example, a gas flow emitted by the holder cools the wafer non-uniformly, the etch becomes less uniform.

These problems are exacerbated in some processes in which the wafer temperature is supposed to change during processing in a predetermined fashion. The problems are exacerbated because it may become more difficult to adjust the gas temperature to reduce the processing non-uniformity. Examples of such processes include dynamic plasma treatment (DPT) described in PCT Publication WO 96/21943. In DPT, the plasma cross section is smaller than the wafer, and hence the plasma contacts at most a portion of the wafer at any given time. The wafer makes multiple passes through the plasma. With each pass, the plasma traces a path on the wafer surface, heating the wafer along the path. The wafer is cooled between the passes. In order for the process results to be uniform across the wafer, the temperature profile of these heating and cooling cycles may have to be uniform for different wafer points processed in different passes. This requirement makes it difficult or impossible to reduce the process non-uniformity by gas flow temperature control.

To reduce or eliminate such disadvantages, some embodiments of the present invention restrict the area in which a gas flow generated by the holder contacts the article. In some embodiments, that area is substantially restricted to the article portion reserved for article handling. For example, in many semiconductor manufacturing processes, each wafer has a peripheral area reserved for wafer handling. The wafer useful area is confined to the rest of the wafer. At least one gas flow generated by the holder does not contact the wafer useful area. Therefore, the temperature non-uniformity in the wafer useful area is reduced.

According to another aspect of the invention, at least one gas outlet in an article holder is positioned opposite to a periphery or a handling portion of the article.

In some embodiments, the holders hold articles which are not being processed.

Other features of the invention are described below. The invention is defined by the appended claims.

DESCRIPTION OF PREFERRED EMBODIMENTS

Figure 1:
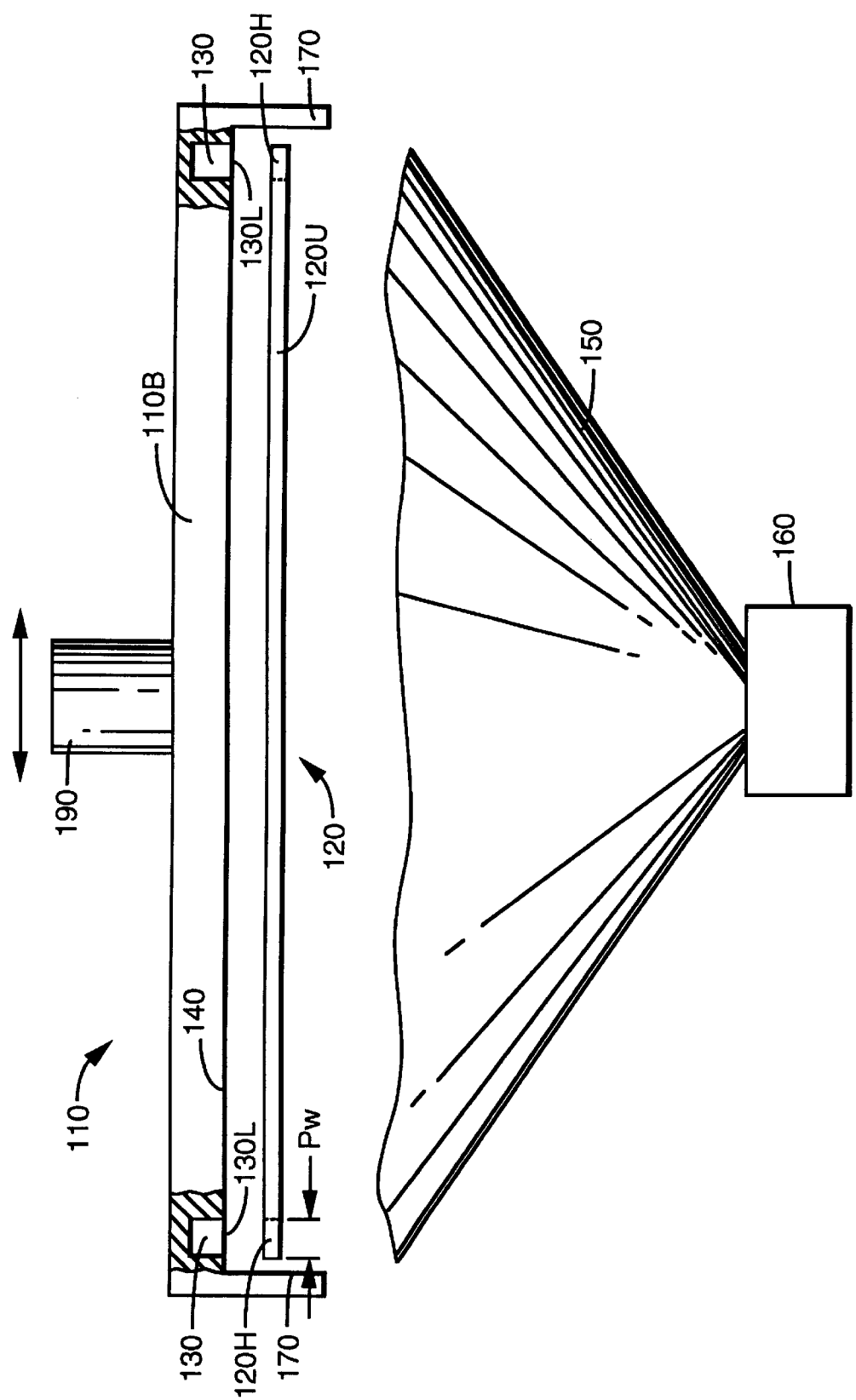
FIG. 1 is a cross-section illustration of a semiconductor wafer processing system according to the present invention.

FIG. 1 illustrates a non-contact wafer holder 110 holding a wafer 120 during processing. Holder 110 includes gas flow generators 130 in holder body 110B. Each gas flow generator 130 has an outlet 130L in wafer facing surface 140 of holder body 110B. A gas flow generated by a generator 130 flows through respective outlet 130L and creates a reduced pressure (vacuum) area between wafer 120 and body 110B to hold the wafer adjacent to the body. In some embodiment, each gas flow is a gas vortex generated by methods known in the art. See, for example, USSR inventor certificate 537924 (Feb. 9, 1977), USSR patent document SU 1812102 (Apr. 30, 1993), and PCT Publications WO 96/21943 (Jul. 18, 1996) and WO 97/45862 (Dec. 4, 1997).

Wafer 120 has a peripheral portion 120H reserved for wafer handling. Portion 120H will be discarded after the integrated circuit manufacturing is complete, and thus no circuit elements to be used after the manufacturing are fabricated in that portion. Area 120H extends along the wafer edge all around the wafer. The width pw of area 120H is about 3 mm in some embodiments.

Figure 2:
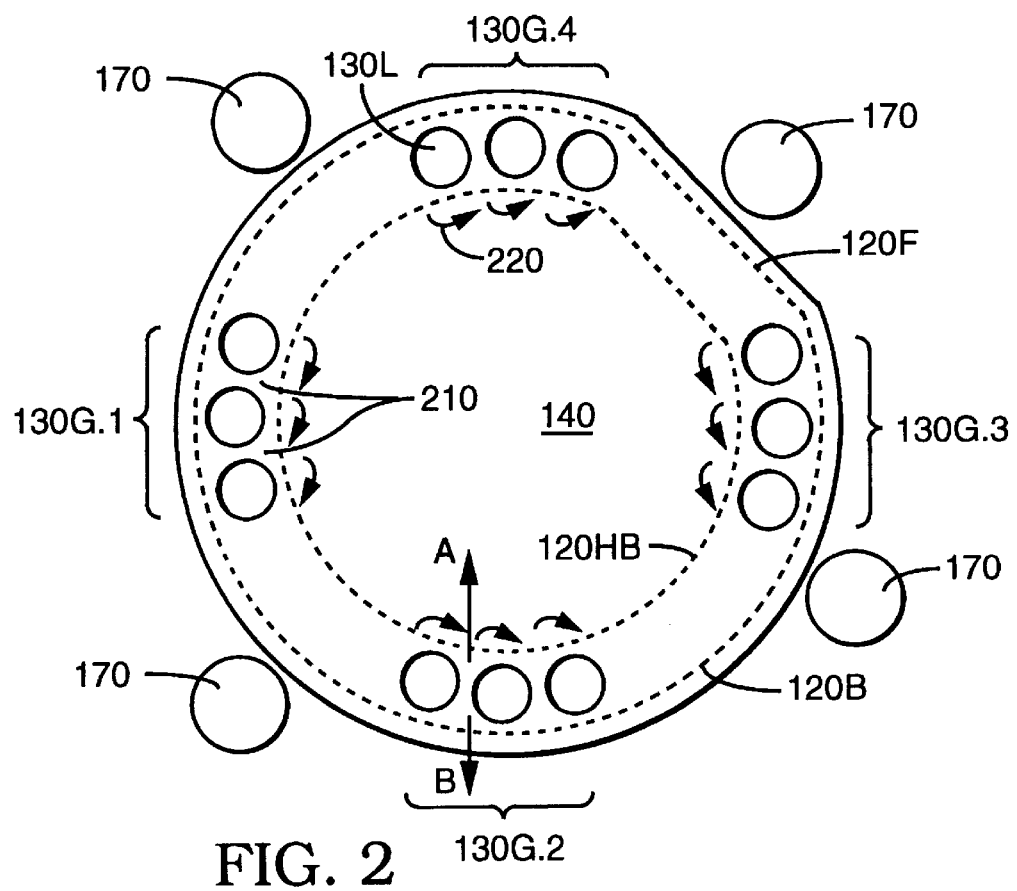
FIGS. 2 and 3 are bottom views of wafer holders in different embodiments of FIG. 1.

Advantageously, the gas vortices generated by generators 130 are substantially restricted to area 120H because each outlet 130L is positioned opposite (directly above) the area 120H and does not laterally extend beyond the area. See FIG. 2 showing the bottom view of holder 110. In FIG. 2, dashed line 120B is the boundary of wafer 120. Dashed line 120HB is the inner boundary of peripheral area 120H. Outlets 130L do not extend beyond the area 120H between the dashed lines 120B and 120HB. While gas can leave the vortex area and contact other parts of the wafer, the gas flow outside the area 120H is slower than in the vortex and hence has a smaller effect on the wafer temperature than the vortex. Therefore, the impact of the gas flow on the wafer useful area 120U is reduced. (Area 120U is the entire wafer minus the peripheral area 120H).

As shown in FIG. 2, the wafer facing surface 140 is slightly larger than the wafer, to accommodate slight variations in wafer sizes. In some embodiments, line 120B represents the boundary of the intersection of all the wafer positions. Thus, the region inside the boundary 120B is filled by wafer points, though the wafer can extend beyond the boundary 120B. Dashed line 120HB represents the outer boundary of the union (i.e., combination) of all the wafer non-handling positions. Thus, the annular region between the dashed lines 120B and 120HB is entirely occupied by the wafer handling area 120H, though the handling area can extend beyond that annular region. Outlets 130L are restricted in bottom view to the region between the boundary lines 120HB, 120B. In some embodiments, the distance between the dashed lines 120HB, 120B (the width of the annular region) is about 3 mm, and the diameter of each outlet 130L is about 2 mm.

In FIG. 2, outlets 130L are shown as circles. However, in some embodiments each outlet has annular or some other shape.

In FIG. 1, wafer 120 is being processed at atmospheric pressure with plasma jet 150 generated by plasma source 160. The process involves deposition, etch, anneal, or some other operation. The process is described above and in the following documents: Yu. M. Agrikov et al., "Dynamic Plasma Treatment of HIC (Hybrid Integrated Circuit) Substrates", Elektronnaya Tehnika, Ser. 10, 5(71), 1988, pages 30–32; PCT publications WO 92/12610 (published Jul. 23, 1992), WO 92/12273 (published Jul. 23, 1992), WO 96/21943 (published Jul. 18, 1996); P. P. Kulik, "Dynamic Plasma Treatment (DPT) of a Surface of a Solid Body", Plazmohimiya-87, Part 2 (U.S.S.R. Academy of Science, Institute Neftehimicheskogo Sinteza im. A. V. Topchieva, Moscow, 1987), pages 4–13; Yu. M. Agrikov et al., "Foundations of a Realization of a Method of Dynamic Plasma Treatment of a Surface of a Solid Body" (same publication, pages 58–96); U.S. patent application Ser. No. 08/781,568 "Plasma Generation and Plasma Processing of Materials" filed Jan. 9, 1997 by O. Siniaguine, now U.S. Pat. No. 5,767,623 issued Jun. 16, 1998; U.S. patent application Ser. No. 60/030,425 "Back-Side Contact Pads" filed Oct. 29, 1996 by O. Siniaguine; PCT Application PCT/US97/18979 "Integrated Circuits and Methods for Their Fabrication" filed Oct. 27, 1997; U.S. patent application Ser. No. 08/975,403 pending "Plasma Processing Methods and Apparatus" filed Nov. 20, 1997 by O. Siniaguine. In particular, in some embodiments, holder 110 is attached to a rotating carousel (not shown) by arm 190, and the holder and the wafer make multiple passes over the plasma jet 150 during processing, as described in the aforementioned U.S. patent application Ser. No. 08/975,403. The plasma cross section at the level of the wafer may or may not be smaller than the wafer. If the plasma cross section is smaller, the plasma contacts at most a portion of the wafer at any given time. In some embodiments, the wafer is held by a non-condact wafer holder during back-side etch. The wafer is diced into dice after the back-side etch. The dice contain integrated circuits.

In FIG. 1, wafer 120 is positioned below the holder 110, and the plasma jet 150 is positioned below the wafer to treat the bottom wafer surface. In other embodiments the wafer is positioned above the wafer holder and the plasma jet is positioned above the wafer to treat the top wafer surface. Other embodiments include non-plasma wafer processing.

In FIGS. 1 and 2, holder body 110B has extensions 170 around the wafer to restrict the wafer lateral movement. Extensions 170 are one or more isolated fingers. One of fingers 170 is positioned against the flat edge 120F of wafer 120 to prevent the wafer from rotating relative to holder 110. In other embodiments, the wafer has a notch, and one of fingers 170 is positioned in the notch to prevent the wafer from rotating relative to the holder.

In some embodiments, extensions 170 form a continuous rim around wafer facing surface 140.

While in FIG. 2 the wafer facing surface 140 has substantially the same shape as the wafer (except that the wafer facing surface is slightly larger than the wafer), in some embodiments the wafer facing surface is shaped differently from the wafer. For example, in some embodiments designed for circular wafers, the wafer facing surface is square with a side slightly larger than the wafer diameter.

Figure 3:
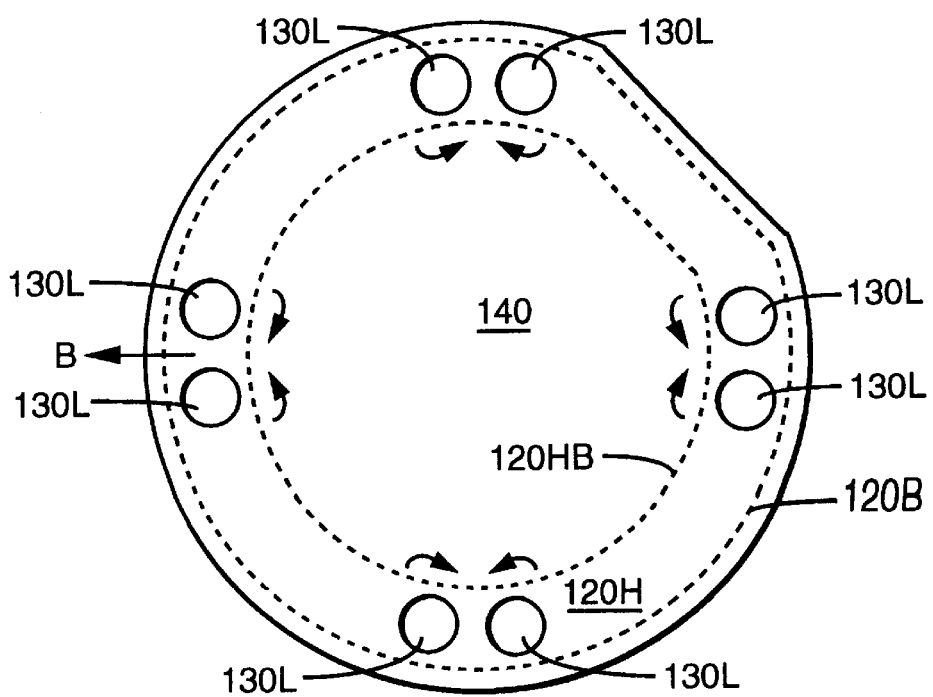

In some embodiments, including the embodiments of FIGS. 2 and 3, more than one vortex generators 130 are provided. The vortex generators are positioned around the wafer periphery so as to balance the wafer.

In FIG. 2, four groups of outlets 130L are provided. Each group 130G.1, 130G.2, 130G.3, 130G.4 has three outlets 130L adjacent to one another. The gas vortices emitted from the adjacent outlets affect the gas motion in areas 210 between the outlets. The direction of each vortex is shown by an arrow such as 220. All the gas vortices in any given group 130G.i have the same direction. As a result, high gas pressure is created in areas 210 between adjacent vortices, and gas flows away from areas 210 towards the inside and the outside of the wafer as shown by respective arrows A and B for group 130G.2. The gas flow in the direction of arrow B (towards the outside of the wafer) impedes the plasma from getting between the wafer and the holder 110. This is advantageous in those embodiments in which only the wafer surface away from the holder (the bottom surface in FIG. 1) is to be processed.

In group 130G.2, gas in each vortex flows clockwise, and in group 130G.4 gas flows in the opposite direction, i.e. counterclockwise. The opposite directions help avoid wafer rotation relative to the holder. Rotation is undesirable because it causes the wafer to rub against extensions 170 and because it makes it harder for the wafer to be loaded into the holder. The vortices in groups 130G.1 and 130G.3 also have different directions.

In FIG. 3, four pairs of adjacent outlets 130L are provided. The gas vortices in the adjacent outlets have opposite directions. The directions are chosen so that between the adjacent vortices, gas flows towards the outside of the wafer (direction B). This impedes the plasma from getting between the wafer and the holder 110. In addition, the opposite directions help avoid wafer rotation relative to the holder.

The invention is not limited by the embodiments described above. In particular, the invention is not limited by the kind of gas in the gas vortices. In some embodiments, the gas is air, nitrogen, or some other gas suitable for the process being used. Some embodiments use the Bernoulli effect generators 130 instead of, or in combination with, vortex generators. In some embodiments, articles 120 are flat panels such as video screens, or some other kind of articles. Other embodiments and variations are within the scope of the invention, as defined by the appended claims.

What is claimed is:

1. A holder for holding an article, the holder comprising one or more gas outlets, each gas outlet for providing a gas flow to hold the article, wherein when the holder holds the article, at least one gas outlet is positioned face-to-face opposite to a periphery of the article, wherein the periphery of the article is 3 mm wide.

2. The holder of claim 1 wherein the article is a semiconductor wafer, and the periphery of the wafer is reserved for wafer handling.

3. The holder of claim 1 further comprising one or more gas vortex generators for generating one or more gas vortices flowing through the respective one or more gas outlets.

4. The holder of claim 3 comprising a plurality of groups of said outlets, wherein adjacent outlets in each group are closer to each other than any two outlets of different groups, and wherein the gas vortices from adjacent outlets in each group are to flow in the same direction, both flowing clockwise or counterclockwise, so as to create high gas pressure between the adjacent vortices.

5. The holder of claim 3 comprising a plurality of groups of said outlets, wherein adjacent outlets in each group are closer to each other than any two outlets of different groups, and wherein the gas vortices from at least two adjacent outlets in each group are to flow in opposite directions such that the gas between the adjacent vortices is to flow away from the article.

6. A non-contact article holder comprising:
a body having a surface which is to face an article to be held by the holder, the surface having a peripheral area which is 3 mm wide; and
a plurality of gas outlets restricted to the peripheral area, for emitting gas towards the article.

7. The non-contact article holder of claim 6 wherein each gas outlet is about 2 mm wide.

8. The non-contact article holder of claim 6 wherein each gas outlet is an outlet of a corresponding gas vortex chamber.

9. The non-contact article holder of claim 8 comprising a plurality of groups of said outlets, wherein adjacent outlets in each group are closer to each other than any two outlets of different groups, and wherein the gas vortices from adjacent outlets in each group are to flow in the same direction, both flowing clockwise or counterclockwise, so as to create high gas pressure between the adjacent vortices.

10. The non-contact article holder of claim 8 comprising a plurality of groups of said outlets, wherein adjacent outlets in each group are closer to each other than any two outlets of different groups, and wherein the gas vortices from at least two adjacent outlets in each group are to flow in opposite directions such that the gas between the adjacent vortices is to flow away from the article.

11. A method for holding an article, the method comprising:
providing a plurality of gas openings facing a periphery of the article, the periphery being 3 mm wide; and
generating gas vortices passing through the openings to reduce pressure between the article and the openings.

12. The method of claim 11 wherein each gas opening is an outlet in a body of an article holder.

13. The method of claim 11 wherein the article comprises semiconductor material.

14. A method for processing an article, the method comprising:
generating a plurality of gas vortices through a plurality of gas outlets to hold the article, wherein the article comprises a handling portion reserved for article handling, and all of said outlets face the handling portion;
wherein the handling portion comprises a peripheral portion of the article; and wherein said peripheral portion is 3 mm wide;
processing the article while the article is being held by the plurality of gas vortices; and then
discarding the handling portion of the article.

15. The method of claim 14 wherein the article is a semiconductor wafer.

16. The method of claim 15 in which one or more integrated circuits are fabricated in the non-discarded portion of the wafer.

17. The method of claim 15 wherein the processing comprises etching the wafer while the wafer is being held by the gas vortices.

18. The method of claim 15 wherein the processing comprises a deposition or an anneal operation.

19. The method of claim 14 wherein the gas vortices hold the article by vacuum proximate to a surface of an article holder, the gas outlets being formed in the surface of the article holder, wherein the article does not physically contact said surface of the article holder while the article is being held by the vortices.

* * * * *